United States Patent

Kalnitsky

[11] Patent Number: 5,633,178
[45] Date of Patent: May 27, 1997

[54] METHOD OF MAKING VOLATILE MEMORY CELL WITH INTERFACE CHARGE TRAPS

[75] Inventor: Alexander Kalnitsky, Grenoble, France

[73] Assignee: SGS-Thomson Microelectronics S.A., Saint Genis, France

[21] Appl. No.: 487,835

[22] Filed: Jun. 7, 1995

Related U.S. Application Data

[62] Division of Ser. No. 343,016, Nov. 21, 1994.

[30] Foreign Application Priority Data

Nov. 29, 1993 [EP] European Pat. Off. ............ 93420474

[51] Int. Cl.[6] .................................................. H01L 21/266
[52] U.S. Cl. ....................... 438/288; 438/910; 438/953
[58] Field of Search ............................. 437/24, 37, 941, 437/959; 148/DIG. 40

[56] References Cited

U.S. PATENT DOCUMENTS

| Re. 31,083 | 11/1982 | DeKeersmaecker et al. | 257/325 |
|---|---|---|---|
| 3,856,587 | 12/1974 | Yamazaki et al. | 437/941 |
| 4,047,974 | 9/1977 | Harari | 437/37 |
| 4,217,601 | 8/1980 | DeKeersmaecker et al. | 257/325 |
| 4,868,618 | 9/1989 | Kalnitsky et al. | 257/314 |

FOREIGN PATENT DOCUMENTS

| 0342778 | 11/1989 | European Pat. Off. . |
| 0451389 | 10/1991 | European Pat. Off. . |

OTHER PUBLICATIONS

European Search Report from European Patent Applications No. 93420474.4, filed Nov. 29, 1993.

Solid State Electronics, vol. 33, No. 5, May 1990, Oxford GB, pp. 523–530, A. Kalnitsky, et al., "Electric States At S1–S102 Interface Introduced by Implantation of S1 in Thermal S102".

*Primary Examiner*—Chandra Chaudhari
*Attorney, Agent, or Firm*—Wolf, Greenfield & Sacks, P.C.; James H. Morris

[57] ABSTRACT

A semiconductor device is described, incorporating electron traps at the interface between a semiconductor substrate and a gate dielectric layer of an insulated gate field effect transistor, such device being capable of retaining charge in the electron traps for a certain time, allowing volatile memory circuits to be produced wherein each cell occupies only the area required for a single transistor.

8 Claims, 2 Drawing Sheets

METHOD OF MAKING VOLATILE MEMORY CELL WITH INTERFACE CHARGE TRAPS

This application is a division of application Ser. No. 08/343,016, filed Nov. 21, 1994, entitled VOLATILE MEMORY CELL and now pending.

BACKGROUND OF THE INVENTION

1. Field of the Invention

This invention relates to a semiconductor device and more particularly to a volatile semiconductor memory device, constructed with a metal-insulator-semiconductor structure.

There are known two basic types of semiconductor memory, one known as volatile memory and one known as non-volatile memory. In volatile memories the stored data is lost when the power supply is removed from the semiconductor device. Non-volatile memory retains the data stored for extended periods after the power supply to the device has been removed.

In a computer architecture, non-volatile memory is used for long-term storage of programs and data which seldom or never change, and volatile memory devices are used for the short-term storage of program instructions and data during the execution of a program.

Known volatile memory devices may be further divided into two categories. Static Random Access Memory (SRAM) consists of flip-flop latches, which each retain one bit of data for as long as power is maintained. In Dynamic Random Access Memory (DRAM), each memory cell is made up from one transistor and a capacitor.

2. Discussion of the Related Art

FIG. 1 shows, schematically, the construction of a typical DRAM cell where C represents the capacitor for storing charge, and T represents the transistor which serves to transport charge to the capacitor, and also, operated under different bias conditions, for reading the charged or uncharged state of the capacitor. The data bit is stored as charge on the capacitor and decays with time, due to the leakage current of the capacitor. Each bit of data in a DRAM device must therefore be periodically refreshed before it has decayed irretrievably.

Known DRAM cells are also susceptible to failure due to incident ionizing radiation. Such radiation may originate in the atmosphere in the form of cosmic rays, in the working environment of the memory device, or even in the packaging materials used to encase the memory device. When a particle or ray of incident radiation meets the memory device, it may cause a temporary conductive path to be established, by forming electron/hole pairs in the dielectric or substrate layers. This conductive path may breach either the dielectric layer of the charge storage capacitor or a P-N junction below the charge storage capacitor, in either case, causing loss of charge and hence loss of stored data.

In known non-volatile memory devices, a charge is stored directly above the channel regions of insulated gate field effect transistors (IGFETs) resulting in the modulation of the IGFET's conductance. This may also be regarded as a modulation of the transistor's threshold voltage. Such a phenomenon is successfully utilized in the manufacture of certain memory devices of the long term storage type. A floating gate of a conductive material such as polycrystalline silicon completely embedded in dielectric layers may be used to hold charge supplied by a tunnelling effect through the surrounding dielectric layers.

Also known (U.S. Pat. No. 4,868,618 by the current inventor) is a long term storage memory device using charge storage above the channel regions of IGFETS in electron traps. Such electron traps are intentionally introduced within the dielectric, separated from the semiconductor/dielectric interface by at least 7 nm (column 3, lines 43 to 47 of U.S. Pat. No. 4,868,618 specify that the highest concentration of ions is not contiguous with the interface, and that a distance of greater than 7 nm is sought). Such traps, buried within the dielectric layer, have a very long storage time.

The volatile memory cells described herebefore have the advantage that they have much faster read and write times than non-volatile memories. They are therefore suitable for use during the execution of computer programs where fast short term memory is required.

Non-volatile memories are suitable for long-term storage of data which rarely or never change, as they retain their data even though the power is removed from the chip, but are very slow to program.

Both volatile and non-volatile memory are thus required in most computer applications, but the volatile memory is a more significant factor in determining the operating speed of a program.

Between the two types of volatile memory available, SRAM has the advantages that no refreshing of the data in the memory is required, leading to easier design of circuits. The memory cycle time of an SRAM may be around 10 ns. This is rather faster than the cycle time for DRAM.

Refreshing of the data contained in a DRAM circuit must typically be done every few milliseconds, and makes for more complicated design than SRAM-based circuits.

These apparent disadvantages are outweighed, at least for reasonably complex circuits requiring large memory capacity, by the fact that DRAM cells are cheaper to manufacture and occupy much less semiconductor surface area than SRAM cells, giving more cells per chip. In 1980, P. Horowitz and W. Hill estimated that DRAM provided 8 times the memory capacity per unit price of a contemporary SRAM cell.

Whereas a major attraction of DRAM volatile memory cells is their much smaller surface area, a limit to the possible size reduction of such a cell is reached because of the physical size of the capacitor required to retain sufficient charge for memory applications, plus the area required for the interconnect between the transistor and the capacitor.

The previously known memory cells using charge storage above the channel of a transistor are only suitable for long term storage memory devices, due to the elevated voltages and relatively long times required to charge or discharge the floating gate or the buried traps. Such memory cells have write cycle times of hundreds of microseconds and are therefore not useful for fast, short term data storage.

SUMMARY OF THE INVENTION

An object of the present invention is to construct a volatile memory cell of much smaller dimension than previously possible.

A further object of the current invention is to construct a volatile memory cell without the need for a separate capacitor.

A further object of the current invention is to provide a memory cell capable of being written to, read, and erased using voltages no higher than normal operating voltages and in a time comparable to that required for known DRAM cells.

A further object of the current invention is to construct a volatile memory cell, with a distributed charge storage, to provide immunity against failures induced by incident ionizing radiation.

The current invention provides a memory cell wherein interface charge traps are present above the channel region of an IGFET, very close to the interface between the semiconductor substrate layer and the dielectric layer. The interface traps are apt to store a charge, which modulates the threshold of the transistor according to the magnitude and polarity of the charge. With fixed voltages applied to the gate, drain and source of the IGFET, the current flowing will be modulated by the stored charge and this modulated current represents the contents of the memory cell.

A memory cell of the current invention may be produced by implanting silicon ions into a silicon dioxide layer on a silicon substrate in regions which will become the memory cell channel regions. Such structure then forms the substrate and gate dielectric layers of an IGFET volatile memory cell of the current invention. This method has the advantage that any silicon ions which straggle into the substrate layer during ion implantation will cause no doping effect and the damage caused may be repaired by an annealing step.

Such implants and the interface traps formed by such implants are discussed in Solid State Electronics, 1990, vol 33, N°5, pages 523-530, "Electronic States at Si—$SiO_2$ Interface Introduced by Implantation of Si in Thermal $SiO_2$", by the current inventor et al. This method is suitable to produce volatile memory cells in N-channel IGFETs.

Because the charge is stored in electron traps, the charges are not free to move through the storage medium. This means that an incident ionizing radiation particle or ray, whilst it may cause ionization and charge loss from the charge traps in its path, the resulting establishment of a temporary conductive path will not cause loss of a large proportion of the stored charge. The charge stored in traps away from the path of the incident ionizing particle or ray is unable to flow towards the conductive path.

BRIEF DESCRIPTION OF THE DRAWINGS

One way of carrying out the invention is described in detail below, with reference to the accompanying drawings which illustrate only one specific embodiment, in which.

Figure 1:
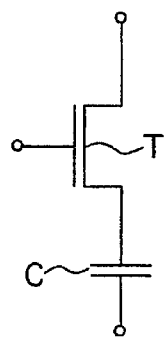
FIG. 1 is a circuit diagram of a known volatile memory cell.
Figure 2:
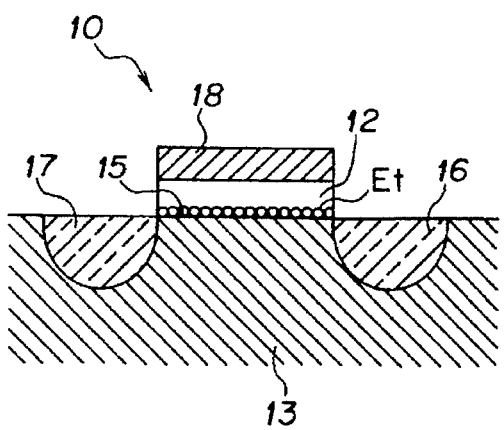
FIG. 2 shows a cross section of a memory cell according to the current invention.

The figures are not drawn to scale, and particularly, the vertical dimensions of FIG. 2 have been exaggerated for clarity.

DETAILED DESCRIPTION

FIG. 2 shows, in cross section, an N-channel memory cell 10 according to the current invention. A silicon dioxide layer 12 and a P-type doped silicon substrate 13 share a common interface 15. N-type drain and source regions 16, 17 are situated at either end of the length of the silicon dioxide layer 12. Electron traps $E_t$ are present in the oxide layer 12 very close to the interface 15, for example, in the oxide layer between the interface and a distance of about 1 nm from the interface. A conductive layer 18 is situated over the oxide layer 12.

The memory cell 10 functions by storing electrical charge in, or dumping electrical charge from, the electron traps $E_t$. When the traps are filled by excess electrons, a negative charge is present at the interface 15. This impedes the formation of an inversion layer at the surface of the silicon 13 when a positive voltage is applied to the gate electrode 18. In effect, the threshold voltage of the transistor 10 is raised. When no charge is stored in the electron traps $E_t$, there is no threshold modification and an inversion layer forms normally at the surface of the semiconductor 13 when the positive gate voltage is applied to the gate electrode 18.

In order to form a memory device of useful capacity, a plurality of memory cells according to the invention will be integrated into a common semiconductor substrate and such cells will be electrically connected together in a matrix of rows and columns, such that any one particular desired cell may be addressed at a time to enable reading and writing operations to be performed on the desired cell.

Figure 3:
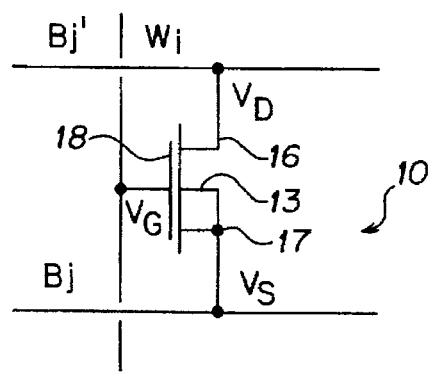
FIG. 3 is a circuit diagram of part of a memory circuit, illustrating the use of a capacitorless volatile memory cell.

FIG. 3 shows typical electrical connections to a volatile memory cell of the current invention. The source 17 and the substrate 13 are electrically connected together and are further connected to a bitline $B_j$ which is connected to a voltage $V_S$; the drain 16 is connected to a bitline $B_j'$ which is connected to a voltage $V_D$ and the gate electrode 18 is connected to a wordline $W_i$ which is connected to a voltage $V_G$.

Reading the contents of a cell is accomplished by applying fixed voltages $V_S$, $V_D$ and $V_G$ to bitlines $B_j$, $B_j'$ and wordline $W_i$ connected to the cell and reading the resulting channel current: a relatively high current corresponding to a normal threshold, hence empty traps $E_t$, and state "0"; a relatively low current corresponding to a raised threshold, hence filled traps $E_t$, and state "1".

Programming or writing the cell involves either filling or emptying the traps $E_t$. Filling is done by biasing the channel of the memory cell into inversion, to cause a substantial excess of electrons to accumulate at the interface 15. With sufficient potential gradient across the oxide the interface traps will fill, writing a "1" into the cell. Emptying the traps is done by biasing the channel of the memory cell into accumulation, to cause a substantial accumulation of holes at the interface 15. With sufficient potential gradient across the oxide, any electrons in the traps will recombine with the holes, causing the traps to empty, writing a "01" to the cell.

Typically, for reading a cell, $V_S=0$ V, $V_G=V_D=+V_{BG}/2$;

for writing a "0" to a cell, $V_S=V_D=0$ V, $V_G=-V_{BG}$;

for writing a "1" to a cell, $V_S=V_D=0$ V, $V_G=+V_{BG}$.

$V_{BG}$ is the minimum voltage required to program a cell, and is not more than the normal operating voltage of volatile memory cells. It is typically 3 V to 5 V. The negative voltage required for writing a "0" may be generated by an on-chip DC conversion circuit.

During a write operation on one cell 10, the other memory cells whose gates are connected to the same wordline $W_i$ must be prevented from being programmed. This is achieved by holding all bitlines other than those ($B_j$, $B_j'$) connected to the cell to be programmed at a voltage being the average of the $V_G$ and $V_D$ of the cell to be programmed. This prevents the other cells from being sufficiently biased into accumulation or inversion for programming.

Once a cell has been programmed, the programming voltages are removed and the charge storage properties of the traps are used to retain the data bit. The interface traps conserve their charge for a certain time, the quantity of charge stored decaying by electron emission. The rate of discharge is significant, due to the proximity of the traps to the semiconductor. To ensure that the data stored in the memory device is retained indefinitely, control circuitry is used to periodically read and rewrite each data bit in the memory device, before the charge stored has decayed irretrievably.

The retention period of any particular cell must be long enough for the memory control circuitry to cyclically refresh all of the cells contained in the memory device before returning to refresh that particular cell once more. The retention period depends on the decay rate, fixed by the close proximity of the traps to the semiconductor and the density of electron traps above the channel region of the cell. The electron traps must, therefore, have a sufficient density that each cell will retain its data long enough for a whole cycle of cell refreshing to be done before the cell becomes unreadable.

The interface electron traps $E_t$, previously described, must have a suitable trap energy level to allow filling or emptying of the traps by normal circuit operating voltages. In the case of N-channel memory cells, this requires the energy traps to have an energy close to the edge of the silicon conduction band. If electron traps are used with an energy too separated from the conduction band edge, the traps will either fill and empty slowly leading to increased programming and erase times, or will not fill at all, preventing the operation of the cell. If electron traps with an energy too close to the conduction band edge are used, the traps will fill and empty very quickly, leading to short retention time. The electron trap energy is a characteristic of the way the traps are produced.

A volatile memory cell according to the current invention may be produced by a method compatible with current semiconductor manufacturing techniques, whereby: a bare P-type doped silicon substrate 13 is heated in an oxidizing atmosphere to grow the silicon dioxide layer 12, typically to a thickness of the order of 30 nm or less and the silicon dioxide layer 12 is implanted with positively charged silicon ions to produce the electron traps $E_t$. A polysilicon conductive layer 18 is then deposited by CVD or any other suitable technique on the oxide layer 12. A photolithography step followed by an etch removes the conductive layer 18 and silicon dioxide layer 12 from all areas other than that where the channels of the volatile memory cells 10 are to be formed. A suitable masking step followed by an implantation or diffusion of n-type impurities forms the source and drain regions 17, 16 respectively.

It is required to place the electron traps $E_t$ as close as possible to the interface 15, and to have a minimum number of electron traps separated from the interface by more than about 0.5 nm. The location of the interface traps corresponds to the resting place of the implanted silicon ions. The electron traps must also be very close to the semiconductor layer to allow fast writing and refreshing of the stored data. A high density of traps must be placed close to the interface 15 and a minimal density of traps located further than 1 nm and preferably 0.5–0.7 nm from the interface 15; this is controlled by varying the implant energy. The electron trap density must be high enough to provide a suitable retention time for a cell of any given size; the density is controlled by varying the implant dose. Suitable doses and energies for any particular application will be easily determined by modelling and experimentation.

Figure 4A:
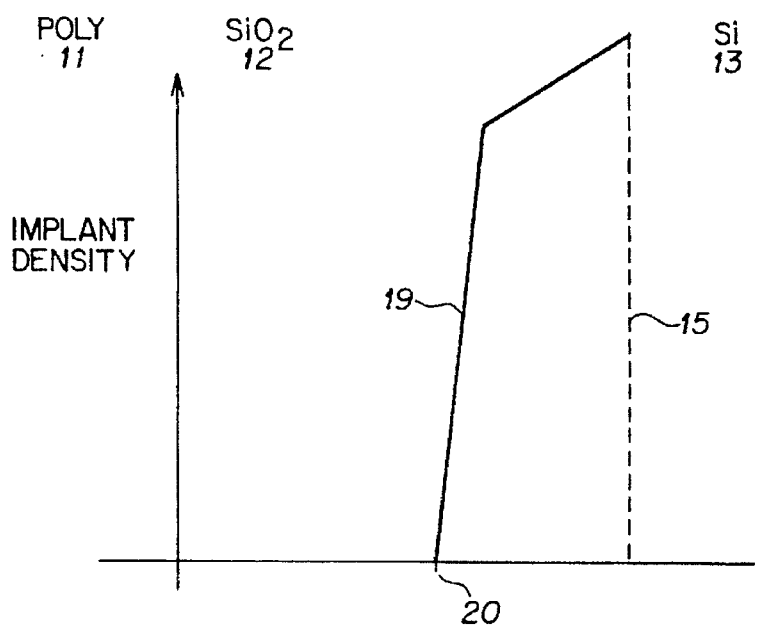
FIG. 4A shows an idealised implant profile of a device according to the invention.

FIG. 4A shows an optimal implant profile for the implantation of the silicon ions (not to scale). The density curve of implanted ions 19 has a peak adjacent to the interface 15, a large number of ions being present between the interface 15 and a limit 20 at about 0.5 nm from the interface, no ions lying outside this range. This is not achievable in current technology.

Figure 4B:
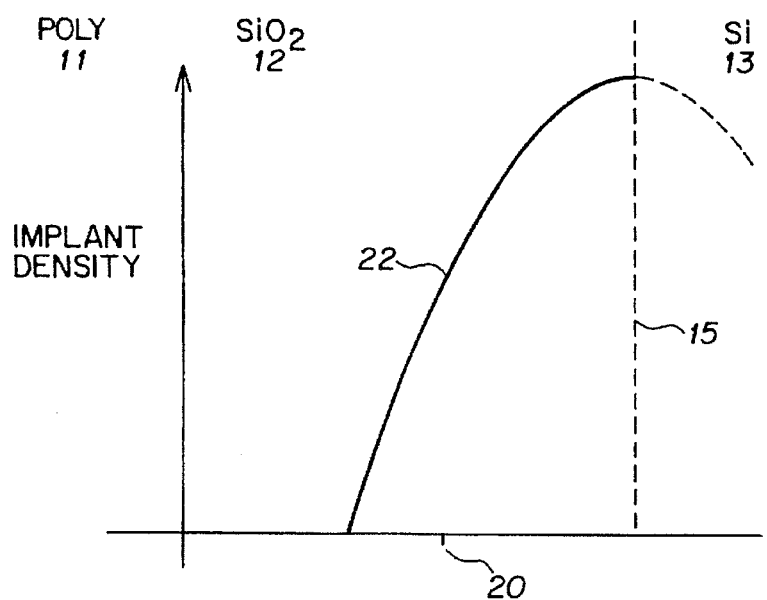
FIG. 4B shows a typical implant profile of a device according to the invention.

FIG. 4B shows a suitable implant profile for the implant of silicon ions according to current technology. The density curve of implanted ions 22 has a peak at or very close to the interface 15. The implant density decreases rapidly with distance from the interface 15 so that as few implanted ions as possible are located further from the interface 15 than the limit 20. The implant parameters—the dose and density—must be designed to produce the highest density of silicon implanted ions at the interface 15. The silicon ions which are implanted into the substrate 13 are annealed to become part of the monocrystalline substrate. No doping effect is caused, and all physical damage resulting from the implant is repaired by the annealing step. Effectively, there are no implanted ions in the substrate.

A suitable implant could be performed at an implant energy of 25 keV or less, with a dose of between $2\times10^{14}$ cm$^{-2}$ to $2\times10^{16}$ cm$^{-2}$, in order to place the peak implant density co-incident with the interface between the silicon substrate and a 22 to 32 nm thick silicon dioxide gate dielectric layer. The dielectric layer of the device is relatively very thin, and only a small change in energy will result in the movement of the peak implant dose over a large portion of the thickness of the dielectric layer. The recommended dose is a compromise between the requirement of a large number of traps near the interface for charge retention and minimizing the number of traps separated from the interface by more than about 0.5 nm.

It will be apparent to one skilled in the art that numerous variants of the current invention are possible, without departing from the spirit of the invention, particularly the use of a P-channel device by reversing the polarity of all voltages, and introducing interface traps of a suitable energy level. The logical significance of traps filled "1" and traps empty "0" may be reversed. Other methods of introducing the required interface traps may also be used, e.g. using particular combinations of semiconductor and dielectric material. Indium phosphide semiconductor with silicon nitride dielectric inherently contains traps of suitable energy levels to produce N-channel devices according to the current invention. All the known improvements, variations and developments of IGFETs—such as change in dielectric thickness, use of complex source and drain construction methods—may be applied to the memory cells of the current invention.

Memory cells as described above have the advantages of occupying a relatively small semiconductor surface area, allowing a much higher memory cell density to be achieved. With the memory cell of the current invention, volatile memory circuits with memory capacities of over $10^9$ bits (1 Gigabit) may be manufactured. Moreover, currently available memory capacities, such as 64 Mbit devices, may be produced with a much lower surface area (approximatey 50% of the typical surface area of current devices), reducing manufacturing cost per die, and increasing die yield. Furthermore, the use of a charge storage means distributed over the surface of the transistor means that the cell is less susceptible to failures induced by incident ionizing radiation.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing descriprtion is by way of example only and is not intended as limiting. The invention is limited only as defined in the following claims and equivalents thereto.

What is claimed is:

1. A method of manufacturing a volatile memory cell including the steps of:

forming a layer of silicon dioxide on a p-type monocrystalline silicon substrate;

covering the silicon dioxide layer with a layer of conductive material and forming a gate electrode of the volatile memory cell; and implanting silicon ions into the silicon dioxide layer so that substantially all of said ions in the silicon dioxide layer are located within approximately 1.0 nm of an interface between the silicon dioxide layer and the silicon substrate.

2. The method of claim 1, wherein the implantation step is carried out before the covering step.

3. The method of claim 1, wherein said silicon dioxide dielectric layer has a thickness of between 22 and 32 nm, and that the implanting step is performed at an energy of 5 to 25 keV, with an implant density of between $2\times10^{14}$ cm$^{-2}$ and $2\times10^{16}$ cm$^{-2}$.

4. A method of manufacturing a memory cell including the steps of:

forming an insulating layer on a semiconductor layer;

forming a conducting layer on the insulating layer, said conducting layer forming a gate electrode, and implanting silicon ions into the insulating layer so that substantially all of said ions in the insulating layer are located within approximately 1.0 nm of an interface between the insulating layer and the semiconductor layer.

5. The method of claim 4 wherein the insulating layer is formed of silicon dioxide.

6. The method of claim 4 wherein the semiconducting layer is formed of a p-type monocrystalline silicon.

7. The method as recited in claim 1 wherein substantially all of the ions are located within approximately 0.5–0.7 nm of the interface.

8. The method as recited in claim 4 wherein substantially all of the ions are located within approximately 0.5–0.7 nm of the interface.

* * * * *